United States Patent
Nam et al.

(10) Patent No.: US 11,942,677 B2
(45) Date of Patent: Mar. 26, 2024

(54) ELECTRONIC DEVICE INCLUDING ANTENNA STRUCTURE

(71) Applicant: Samsung Electronics Co., Ltd., Suwon-si (KR)

(72) Inventors: In Nam, Suwon-si (KR); Youngkon Lim, Suwon-si (KR); Jongdoo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 336 days.

(21) Appl. No.: 17/518,951

(22) Filed: Nov. 4, 2021

(65) Prior Publication Data

US 2022/0085489 A1   Mar. 17, 2022

Related U.S. Application Data

(63) Continuation of application No. PCT/KR2021/012260, filed on Sep. 9, 2021.

(30) Foreign Application Priority Data

Sep. 15, 2020  (KR) .......................... 10-2020-0118555

(51) Int. Cl.
  *H04M 1/02*   (2006.01)
  *H01Q 1/02*   (2006.01)
  (Continued)

(52) U.S. Cl.
  CPC ............... *H01Q 1/243* (2013.01); *H01Q 1/02* (2013.01); *H01Q 1/38* (2013.01); *H01Q 1/526* (2013.01); *H01Q 7/00* (2013.01)

(58) Field of Classification Search
  CPC ............ H01Q 1/243; H01Q 1/02; H01Q 1/38; H01Q 1/526; H01Q 7/00; H01Q 1/24;
  (Continued)

(56) References Cited

U.S. PATENT DOCUMENTS 8,718,938 B2   5/2014  Wolf et al.
8,959,270 B2   2/2015  De Cesare et al.
              (Continued)

FOREIGN PATENT DOCUMENTS

EP          3 048 666 A2   7/2016
KR     10-2015-0047347 A   5/2015
              (Continued)

OTHER PUBLICATIONS

International Search Report and Written Opinion dated Dec. 17, 2021, issued in International Patent Application No. PCT/KR2021/012260.

(Continued)

*Primary Examiner* — Andrew Wendell
(74) *Attorney, Agent, or Firm* — Jefferson IP Law, LLP

(57) ABSTRACT

An electronic device is provided. The electronic device includes a housing, a substrate disposed in an internal space of the housing, a battery disposed on a plane identical with a plane of the substrate, a support structure disposed to at least partially overlap the substrate when the substrate is viewed from a top, an antenna structure configured to include a dielectric substrate and at least one coil member disposed in the dielectric substrate as an antenna disposed to at least partially overlap the battery when the battery is viewed from the top, a tape member configured to include a first region at least partially overlapping the support structure, a second region at least partially overlapping the antenna structure, and a connection part connecting the first region and the second region when the support structure is viewed from the top. The dielectric substrate may include at least one extension part extended from the dielectric substrate and configured to at least partially overlap the connection part when the antenna structure is viewed from the top. The at least one extension part may include a plurality (Continued)

of dummy patterns formed at designated intervals and/or in a designated shape.

20 Claims, 12 Drawing Sheets

(51) Int. Cl.
*H01Q 1/24* (2006.01)
*H01Q 1/38* (2006.01)
*H01Q 1/52* (2006.01)
*H01Q 7/00* (2006.01)
*H04B 1/03* (2006.01)
*H04B 1/08* (2006.01)

(58) Field of Classification Search
CPC ............ H01Q 5/40; H01Q 7/06; H01Q 21/28; H05K 7/20; H05K 9/00; H05K 7/20409; H05K 9/0024; H04B 1/03; H04B 1/04; H04B 1/08; H04B 1/16; H04B 1/40; H04M 1/02
See application file for complete search history.

(56) References Cited

U.S. PATENT DOCUMENTS

| | | | |
|---|---|---|---|
| 8,984,199 | B2 | 3/2015 | Hammarlund et al. |
| 9,368,879 | B1* | 6/2016 | Manry, Jr. ............. H01Q 21/26 |
| 9,496,082 | B2 | 11/2016 | Park et al. |
| 10,269,005 | B2 | 4/2019 | Lee et al. |
| 10,709,051 | B2 | 7/2020 | Cho et al. |
| 2009/0046020 | A1* | 2/2009 | Kato ....................... H01Q 1/38 |
| | | | 343/702 |
| 2011/0279948 | A1* | 11/2011 | Morita ..................... H01Q 1/38 |
| | | | 361/679.01 |
| 2014/0342670 | A1 | 11/2014 | Kang et al. |
| 2015/0185054 | A1 | 7/2015 | Hesch et al. |
| 2015/0255853 | A1* | 9/2015 | Kwong ..................... H01Q 1/24 |
| | | | 343/702 |
| 2016/0218422 | A1* | 7/2016 | Choi ...................... H01Q 1/243 |
| 2016/0309007 | A1* | 10/2016 | Irci ....................... H01Q 1/243 |
| 2017/0237149 | A1 | 8/2017 | Lee et al. |
| 2018/0013186 | A1* | 1/2018 | Murano .................. H01P 1/184 |
| 2018/0358687 | A1 | 12/2018 | Cho et al. |
| 2019/0097278 | A1* | 3/2019 | Park ....................... H04B 5/0037 |
| 2019/0123441 | A1* | 4/2019 | Sudo ...................... H01Q 1/243 |
| 2020/0084528 | A1 | 3/2020 | Jeong et al. |
| 2021/0328334 | A1* | 10/2021 | Cooper .................. H01Q 1/526 |
| 2023/0098313 | A1* | 3/2023 | Lee ........................ H01Q 1/243 |
| | | | 343/846 |
| 2023/0334281 | A1* | 10/2023 | Finn ................. G06K 19/07794 |

FOREIGN PATENT DOCUMENTS

| | | |
|---|---|---|
| KR | 10-2017-0018370 A | 2/2017 |
| KR | 10-1760233 B1 | 7/2017 |
| KR | 10-2018-0060578 A | 6/2018 |
| KR | 10-2018-0065688 A | 6/2018 |
| KR | 10-2022666 B1 | 9/2019 |
| KR | 10-2017621 B1 | 10/2019 |
| KR | 10-2020-0004506 A | 1/2020 |
| KR | 10-2020-0030237 A | 3/2020 |

OTHER PUBLICATIONS

European Search Report dated Dec. 13, 2023, issued in European Application No. 21869626.8.

* cited by examiner

ELECTRONIC DEVICE INCLUDING ANTENNA STRUCTURE

CROSS-REFERENCE TO RELATED APPLICATION(S)

This application is a continuation application, claiming priority under § 365(c), of an International application No. PCT/KR2021/012260, filed on Sep. 9, 2021, which is based on and claims the benefit of a Korean patent application number 10-2020-0118555, filed on Sep. 15, 2020, in the Korean Intellectual Property Office, the disclosure of which is incorporated by reference herein in its entirety.

TECHNICAL FIELD

The disclosure relates to an electronic device including an antenna structure.

BACKGROUND ART

An electronic device may include at least one antenna for supporting wireless communication services using various frequency bands. The at least one antenna may be disposed to manifest excellent radiation performance while not being influenced by structures or electronic parts disposed nearby in an internal space of the electronic device. An antenna structure including the at least one antenna may be connected to a support structure disposed in the internal space of the electronic device through a tape member.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

As an electronic device is designed in a form that becomes slim, an internal space of the electronic device may be narrowed. As the internal space of the electronic device is narrowed, a space where a tape or an attachment for preventing a movement of an antenna structure can be attached may not be available in terms of the internal structure of the electronic device. Aspects of the disclosure are to address at least the above-mentioned problems and/or disadvantages and to provide at least the advantages described below. Accordingly, an aspect of the disclosure is to provide a connection part of a tape member that connects the antenna structure and a support structure may be cut off due to the movement of the antenna structure.

Solution to Problem

According to various embodiments of the disclosure, at least one extension part extended from an antenna structure and disposed to overlap at least part of a connection part that connects the antenna structure and a support structure may include a plurality of dummy patterns formed at designated intervals and/or in a designated shape.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a substrate disposed in an internal space of the housing, a battery disposed on a plane identical with a plane of the substrate, a support structure disposed to at least partially overlap the substrate when the substrate is viewed from the top, an antenna structure configured to include a dielectric substrate and at least one coil member disposed in the dielectric substrate as an antenna structure disposed to at least partially overlap the battery when the battery is viewed from the top, a tape member configured to include a first region at least partially overlapping the support structure, a second region at least partially overlapping the antenna structure, and a connection part connecting the first region and the second region when the support structure is viewed from the top. The dielectric substrate may include at least one extension part extended from the dielectric substrate and configured to at least partially overlap the connection part when the antenna structure is viewed from the top. The at least one extension part may include a plurality of dummy patterns formed at designated intervals and/or in a designated shape.

Advantageous Effects of Invention

According to various embodiments of the disclosure, the at least one extension part extended from the antenna structure may include the plurality of dummy patterns formed at designated intervals and/or in a designated shape. Accordingly, the stiffness of the connection part that connects the antenna structure and the support structure can be increased.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
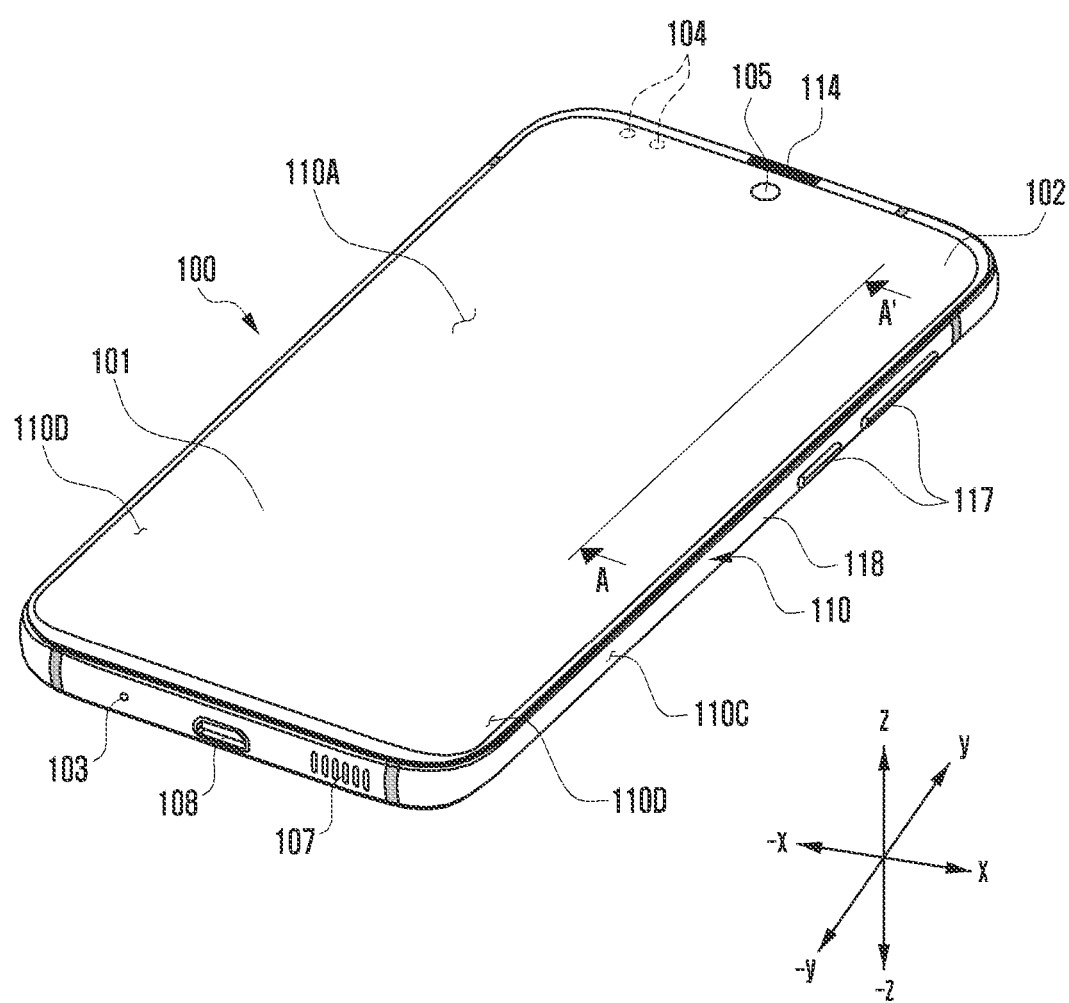
FIG. 1 is a perspective view showing a front surface of an electronic device according to an embodiment of the disclosure.

FIG. 1 is a perspective view showing a front surface of an electronic device according to an embodiment of the disclosure.

Figure 2:
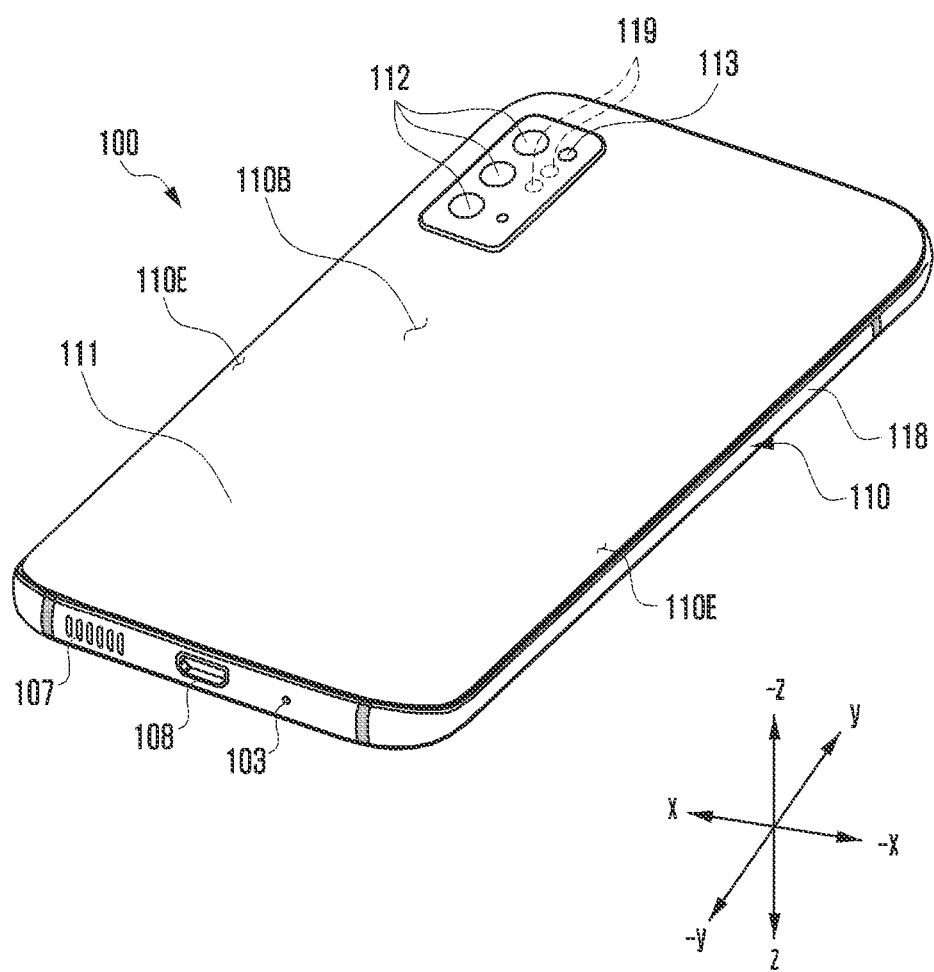
FIG. 2 is a perspective view showing a rear surface of an electronic device shown in FIG. 1 according to an embodiment of the disclosure.

FIG. 2 is a perspective view showing a rear surface of the electronic device shown in FIG. 1 according to an embodiment of the disclosure.

Referring to FIGS. 1 and 2, an electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The electronic device 100 may include at least one of a display 101, audio modules 103, 107 and 114, sensor modules 104 and 119, camera modules 105, 112 and 113, a key input device 117, an indicator, and connector hole 108. The electronic device 100 may omit at least one (e.g., the key input device 117 or the indicator) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole (e.g., audio module 103) and speaker holes (e.g., audio modules 107 and 114), respectively. The microphone hole (e.g., audio module 103) may contain a microphone disposed therein for acquiring external sounds and, in a case, contain a plurality of microphones to sense a sound direction. The speaker holes (e.g., audio modules 107 and 114) may be classified into an external speaker hole (e.g., audio module 107) and a call receiver hole (e.g., audio module 114). The microphone hole (e.g., audio module 103) and the speaker holes (e.g., audio modules 107 and 114) may be implemented as a single hole, or a speaker (e.g., a piezo speaker) may be provided without the speaker holes (e.g., audio modules 107 and 114).

The sensor modules 104 and 119 may generate electrical signals or data corresponding to an internal operating state of the electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device (e.g., camera module 105) disposed on the first surface 110A of the electronic device 100, and a second camera device (e.g., camera module 112) and/or a flash (e.g., camera module 113) disposed on the second surface 110B. The camera module 105 or the camera module 112 may include one or more lenses, an image sensor, and/or an image signal processor. The flash (e.g., camera module 113) may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The electronic device 100 may not include some or all of the key input device 117 described above, and the key input device 117 which is not included may be implemented in another form such as a soft key on the display 101. The key input device 117 may include the sensor module disposed on the second surface 110B of the housing 110. In another embodiment, the key input device 117 may be implemented using a pressure sensor included in the display 101.

The indicator may be disposed on the first surface 110A of the housing 110. For example, the indicator may provide status information of the electronic device 100 in an optical form. The indicator may provide a light source associated with the operation of the camera module 105. The indicator may include, for example, a light emitting diode (LED), an infrared (IR) LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules of camera modules 105 and 112, some sensor modules of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
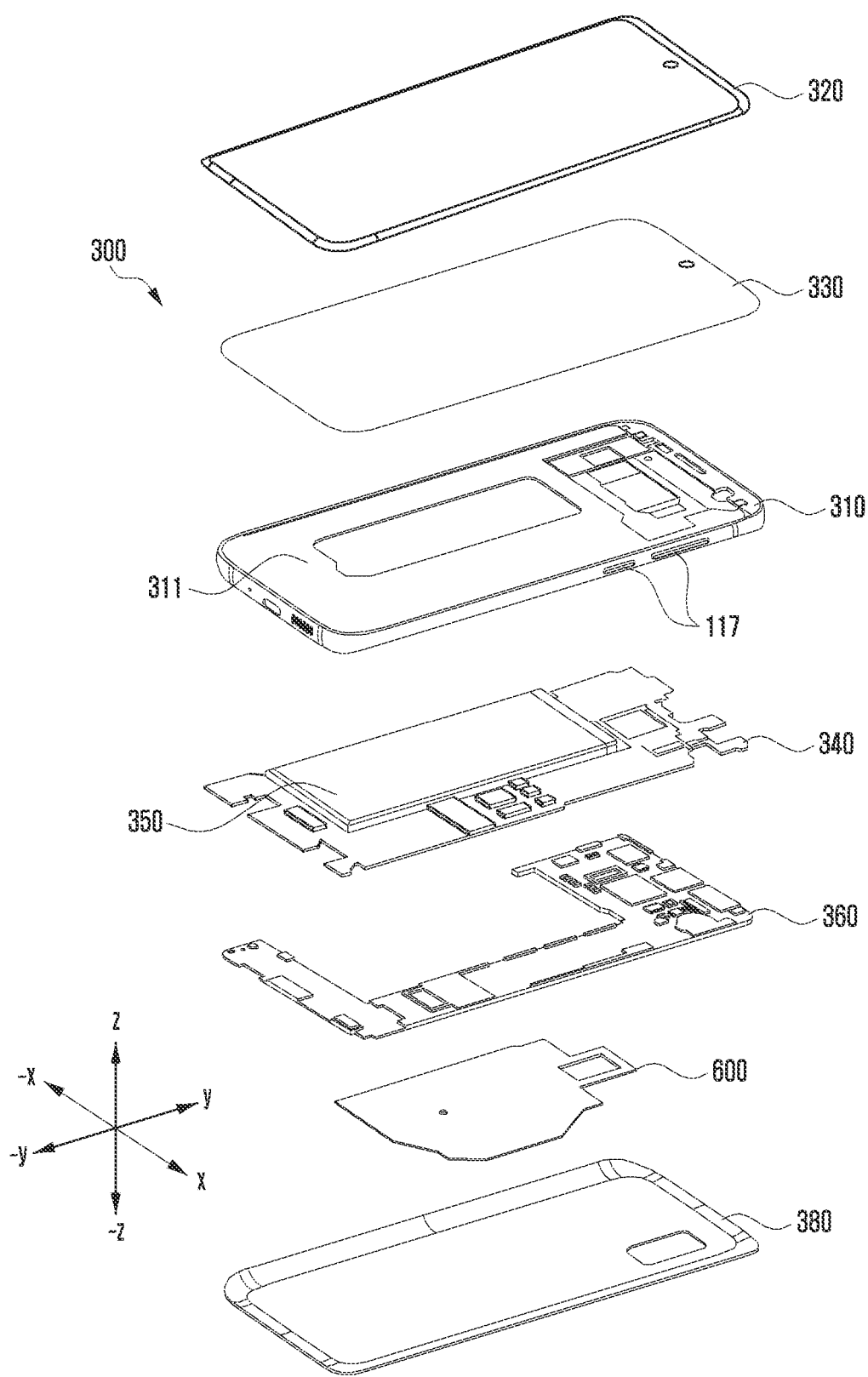
FIG. 3 is an exploded perspective view of an electronic device of FIG. 1 according to an embodiment of the disclosure.

FIG. 3 is an exploded perspective view of the electronic device of FIG. 1 according to an embodiment of the disclosure.

The electronic device 300 shown in FIG. 3 may be similar, at least in part, to the electronic device 100 in FIGS. 1 and 2, or may further include another embodiment of the electronic device.

Referring to FIG. 3, an electronic device 300 may include a lateral bezel structure 310, a first support member 311 (e.g., a bracket), a front plate 320 (e.g., a front cover), a display 330 (e.g., a display 101), an electromagnetic induction panel (not shown), a substrate 340 (e.g., a printed circuit board (PCB) or FPCB (flexible PCB), or RFPCB (rigid-flexible PCB)), a battery 350, a second support member 360 (e.g., a rear case), an antenna structure 600, and a rear plate 380 (e.g., a rear cover). The electronic device 300 may omit at least one (e.g., the first support member 311 or the second support member 360) of the above components or may further include another component. Some components of the electronic device 300 may be the same as or similar to those of the electronic device 100 shown in FIG. 1 or FIG. 2, thus, descriptions thereof are omitted below.

The first support member 311 is disposed inside the electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with a printed circuit board (PCB) (e.g., substrate 340) at the other side thereof. On a PCB (e.g., substrate 340), a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on substantially the same plane as a PCB (e.g., substrate 340). The battery 350 may be integrally disposed within the electronic device 300, and may be detachably disposed from the electronic device 300.

The antenna structure 600 may be disposed between the rear plate 380 and the battery 350. The antenna structure 600 may include, for example, a near field communication (NFC) antenna, a wireless charging antenna, and/or a magnetic secure transmission (MST) antenna. The antenna structure 600 may perform short-range communication with an external device, or transmit and receive power required for charging wirelessly. An antenna structure may be formed by a part or combination of the lateral bezel structure 310 and/or the first support member 311.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device 100). For example, a processor of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 4:
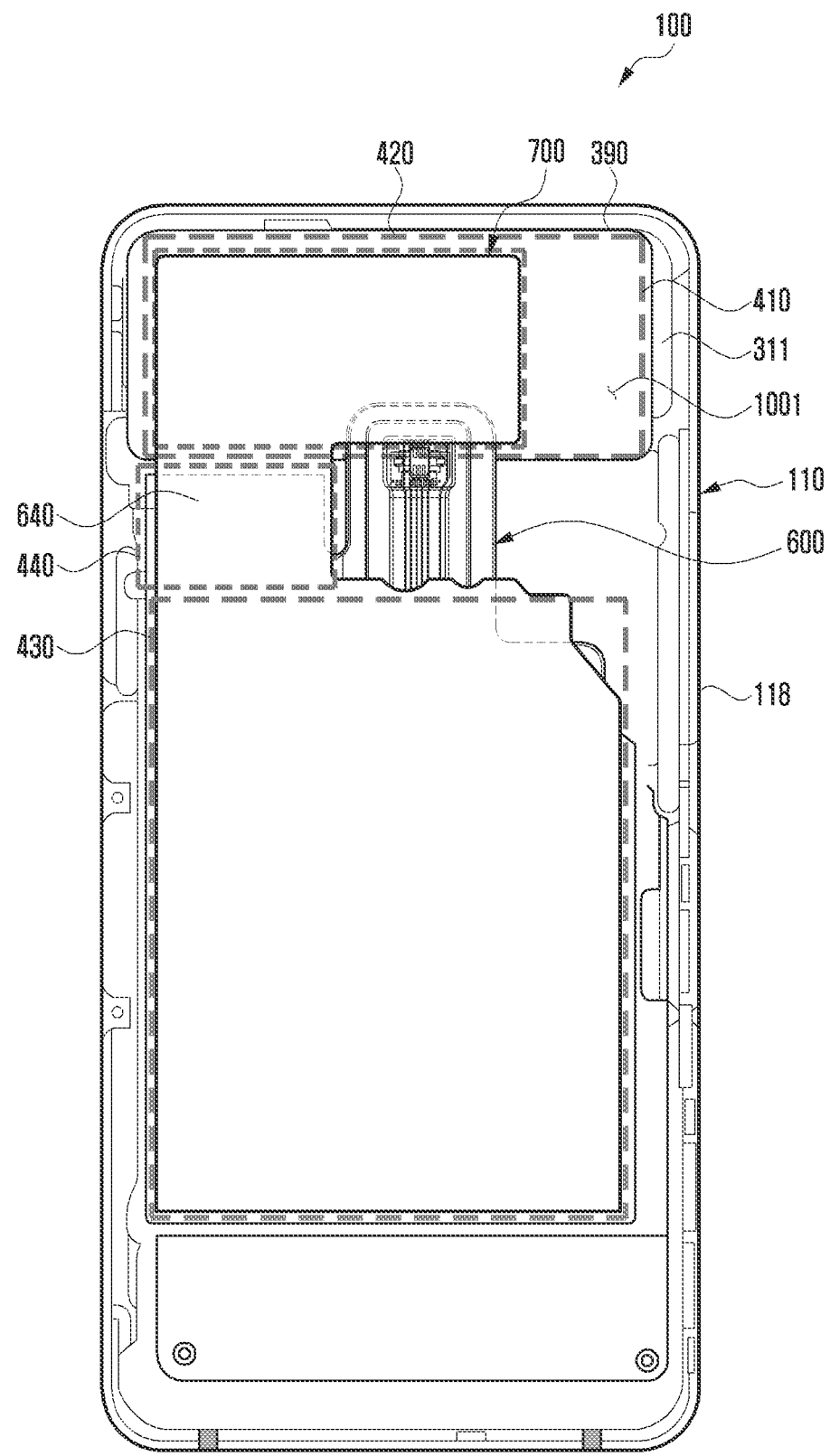
FIG. 4 is a diagram illustrating a configuration of an electronic device including a support structure, an antenna structure, and a tape member according to an embodiment of the disclosure.

FIG. 4 is a diagram illustrating a configuration of an electronic device. An electronic device 100 of FIG. 4 may include a support structure 390, an antenna structure 600, and a tape member 700 according to an embodiment of the disclosure.

Referring to FIG. 4, an electronic device 100 may include a housing 110, including a front plate (e.g., the front plate 102 in FIG. 1 or the front plate 320 in FIG. 3), a rear plate (e.g., the rear plate 180 in FIG. 1 or the rear plate 380 in FIG. 3) toward a direction opposite to the direction of the front plate 102, and the side member (e.g., lateral bezel structure 118) surrounding an internal space 1001 between the front plate and the rear plate. The electronic device 100 may include a support member 311 at least partially extended from the side member (e.g., lateral bezel structure 118) of the electronic device 100 to the internal space 1001.

In an embodiment, the electronic device 100 may include a substrate 410 (e.g., the substrate 340 in FIG. 3) disposed in the internal space 1001 in a way to at least partially overlap the support member 311. At least one electrical element, such as an application processor (AP), a communication processor (CP), a memory and/or an interface, may be disposed in the substrate 410.

In an embodiment, the electronic device 100 may include the support structure 390 disposed in a way to at least partially overlap the substrate 410. The support structure 390 may be configured to support at least one electronic part (e.g., the substrate 410 or the display 330) disposed in the internal space 1001.

In an embodiment, the electronic device 100 may include then antenna structure 600 disposed in the internal space 1001. The antenna structure 600 may be disposed near the substrate 410. For example, the antenna structure 600 may be disposed under (e.g., the −z direction in FIG. 3) a battery (e.g., the battery 350 in FIG. 3) in a way to at least partially overlap the battery 350. The antenna structure 600 may be disposed to overlap at least part of the substrate 410. The antenna structure 600 may include a dielectric substrate (not illustrated) and at least one coil member (not illustrated) disposed in the dielectric substrate. For example, the at least one coil member may include a coil member supporting NFC communication, MST communication and/or wireless charging. The dielectric substrate may include at least one extension part 640 extended from the dielectric substrate.

In an embodiment, the electronic device 100 may include the tape member 700. The tape member 700 may include a first region 420, a second region 430, and a connection part 440 connecting the first region 420 and the second region 430.

In an embodiment, when the support structure 390 is viewed from the top, the first region 420 of the tape member 700 may at least partially overlap the support structure 390. The second region 430 of the tape member 700 may at least partially overlap the antenna structure 600. The connection part 440 of the tape member 700 may at least partially overlap the at least one extension part 640 extended from the dielectric substrate of the antenna structure 600.

The at least one extension part 640 according to various embodiments may include a plurality of dummy patterns (not illustrated) formed at designated intervals and/or in a designated shape in order to increase stiffness. The at least one extension part 640 may be attached to the connection part 440 of the tape member 700 through an adhesion member.

Figure 5:
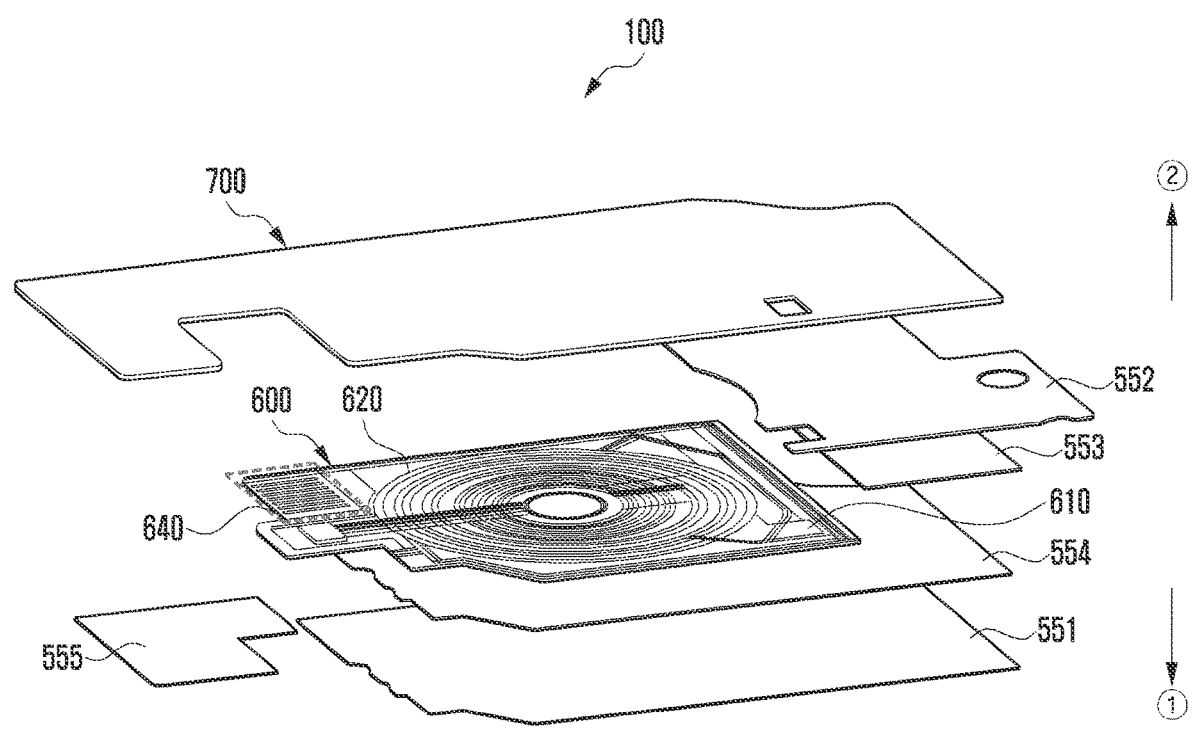
FIG. 5 is an exploded perspective view of an electronic device of FIG. 1 according to an embodiment of the disclosure.

FIG. 5 is an exploded perspective view of an electronic device of FIG. 1 according to an embodiment of the disclosure.

Referring to FIG. 5, an antenna structure 600 may be disposed between a tape member 700 and a sealing member 551. The antenna structure 600 may include a dielectric substrate 610 and at least one coil member 620 disposed in the dielectric substrate 610. The dielectric substrate 610 may include the at least one extension part 640 extended from the dielectric substrate 610. The at least one extension part 640 may include a plurality of dummy patterns formed at designated intervals and/or in a designated shape in order to increase stiffness. The at least one extension part 640 may be attached to the tape member 700 through an adhesion member 555. For example, the adhesion member 555 may include conductive sponge or conductive poron.

In various embodiments, the electronic device 100 may include a shielding member disposed at the top (e.g., a second direction (e.g., a direction ②)) (e.g., the −z direction in FIG. 3) of the at least one extension part 640 extended from the dielectric substrate 610. The at least one extension part 640 includes the plurality of dummy patterns formed at designated intervals and/or in a designated shape, and has the shielding member disposed therein, so that the stiffness of the at least one extension part 640 can be further increased.

In various embodiments, as the shielding member is disposed on the at least one extension part 640, the deterioration of radiation performance of the at least one coil member 620 attributable to coupling (or indirect coupling) between the at least one coil member 620 and the plurality of dummy patterns of the at least one extension part 640 can be prevented.

In an embodiment, the electronic device 100 may include a shielding member 554 disposed between the antenna structure 600 and the sealing member 551. The shielding member 554 can block signals, transmitted and received through the at least one coil member 620 of the antenna structure 600, from affecting a part disposed in a first direction (e.g., a direction ①) (e.g., the z direction in FIG. 3). For example, the shielding member 554 may include a protective film, a graphite sheet and/or a shielding sheet.

In an embodiment, the electronic device 100 may include a functional member disposed between the tape member 700 and the sealing member 551. The functional member may include a step compensation member 553 and/or a heat dissipation member 552. For example, the step compensation member 553 may be configured to compensate for a thickness of the antenna structure 600. The heat dissipation member 552 may play a role to uniformly distribute heat (e.g., a function of efficiently transferring heat) generated from an electrical element (e.g., an application processor (AP), a communication processor (CP), a memory and/or an interface).

Figure 6A:
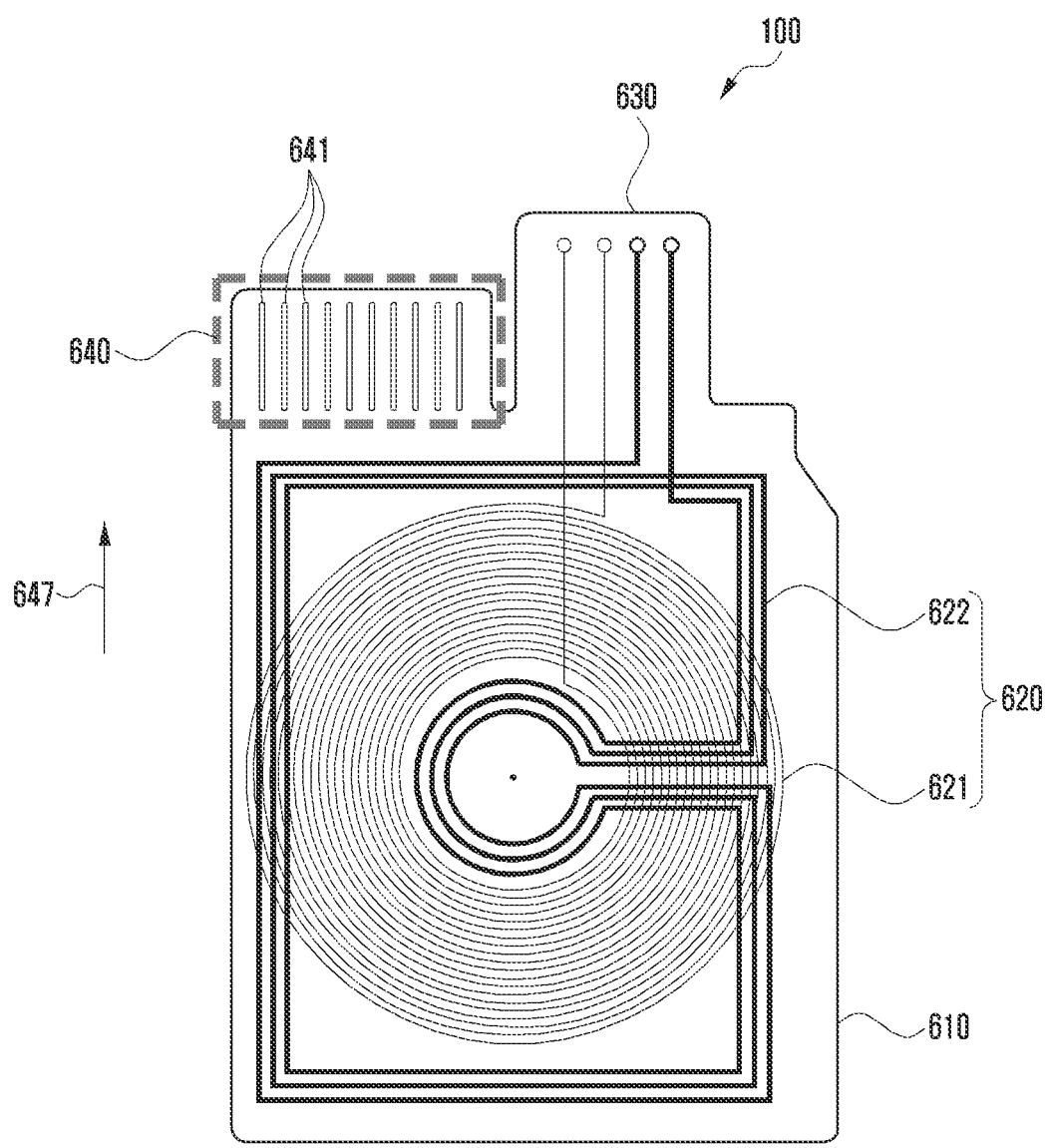
FIG. 6A is a diagram illustrating an antenna structure according to an embodiment of the disclosure.

FIG. 6A is a diagram illustrating an antenna structure according to an embodiment of the disclosure.

Referring to FIG. 6A, an antenna structure 600 may include a dielectric substrate 610 and at least one coil member 620 disposed in the dielectric substrate 610. The dielectric substrate 610 may include the at least one extension part 640 extended from the dielectric substrate 610. The at least one extension part 640 may include a plurality of dummy patterns 641 formed at designated intervals and/or in a designated shape. For example, the plurality of dummy patterns 641 may be formed to have respective lengths at designated intervals from the antenna structure 600 to a direction 647 of a substrate (e.g., the substrate 410 in FIG. 4), but the disclosure is not limited thereto.

In various embodiments, since the plurality of dummy patterns 641 included in the at least one extension part 640 is formed at designated intervals and/or in a designated shape, the stiffness of the at least one extension part 640 can be further increased.

In FIG. 6A according to various embodiments, the plurality of dummy patterns 641 has been described as having the lengths at the designated intervals in the direction 647 of the substrate 410, but the disclosure is not limited thereto. For example, in relation to the plurality of dummy patterns 641, various embodiments will be described with reference to FIG. 9 to be described later.

In an embodiment, the antenna structure 600 may include a connector unit 630 disposed so that the at least one coil member 620 (e.g., a first coil member 621 and a second coil member 622) is elongated through the dielectric substrate 610. The connector unit 630 may be electrically connected to the substrate 410.

In an embodiment, the at least one coil member 620 may include the first coil member 621 and the second coil member 622. The first coil member 621 may include a coil member that transmits and/or receives signals having a frequency band designated to be used for NFC communication. The second coil member 622 may include a coil member that supports wireless charging. For example, the second coil member 622 may transmit and/or receive power in a frequency band corresponding to a wireless power consortium (WPC) standard. The second coil member 622 may transmit, to a battery (e.g., the battery 350 in FIG. 3), power wirelessly received from an external device (e.g., a charging device). Although not illustrated, the at least one coil member 620 may include a third coil member. The third coil member may include a coil member that supports MST communication.

In an embodiment, the electronic device 100 may include a wireless communication circuit that transmits and/or receives a radio signal in at least one frequency band through the at least one coil member 620, for example, the first coil member 621. The electronic device 100 may include a charging circuit that transmits and/or receives wireless charging signals through the at least one coil member 620, for example, the second coil member 622.

Figure 6B:
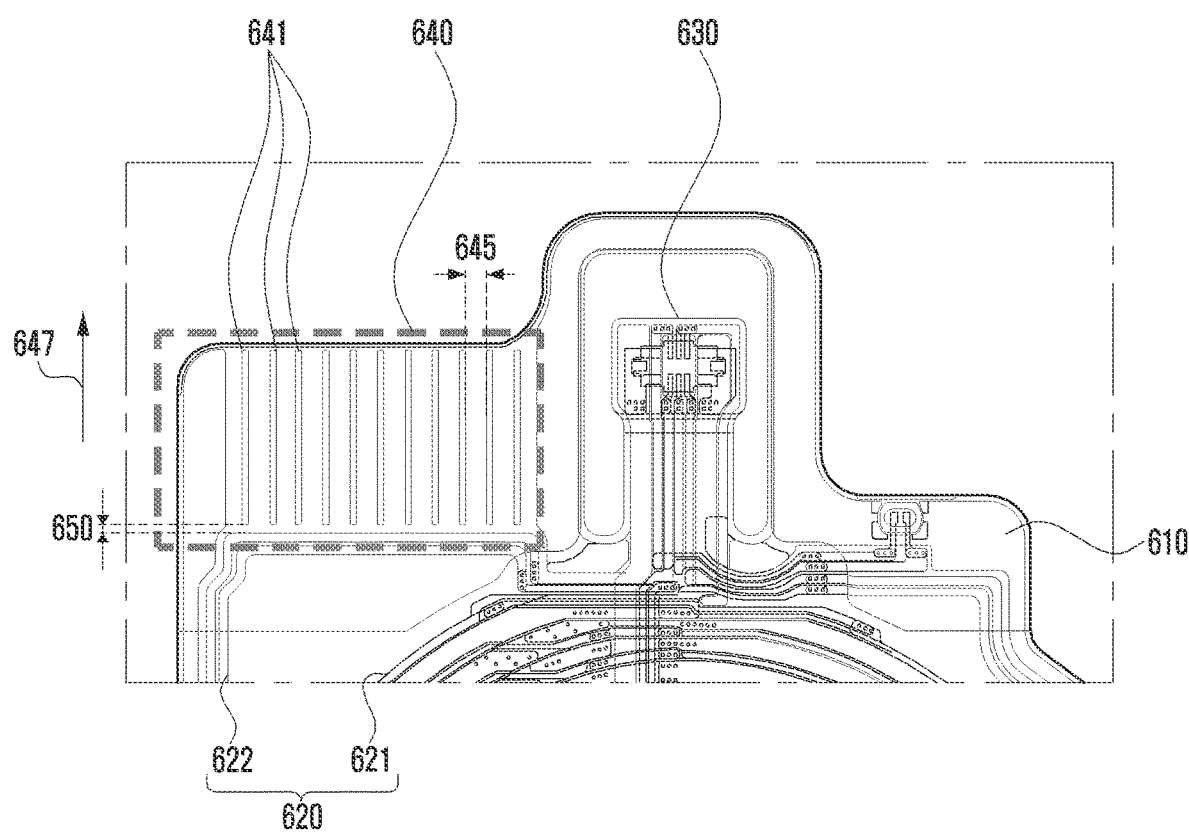
FIG. 6B is a diagram illustrating that some region of an antenna structure of FIG. 6A has been enlarged according to an embodiment of the disclosure.

FIG. 6B is a diagram illustrating that some region of an antenna structure of FIG. 6A has been enlarged according to an embodiment of the disclosure.

Referring to FIG. 6B, an antenna structure 600 may include a dielectric substrate 610 and at least one coil member 620 disposed in the dielectric substrate 610, for example, a first coil member 621 and a second coil member 622. The dielectric substrate 610 may include the at least one extension part 640 extended from the dielectric substrate 610. The at least one extension part 640 may include the plurality of dummy patterns 641 formed to have respective lengths at designated intervals 645 from the dielectric substrate 610 to the direction 647 of a substrate (e.g., the substrate 410 in FIG. 4).

In various embodiments, the plurality of dummy patterns 641 of the at least one extension part 640 may be formed to be isolated from the at least one coil member 620, for example, the first coil member 621 and/or the second coil member 622, at a designated distance 650. For example, the distance between the plurality of dummy patterns 641 and the at least one coil member 620 may be determined not to affect radiation performance of the at least one coil member 620.

In various embodiments, as the plurality of dummy patterns 641 of the at least one extension part 640 is formed to be isolated from the first coil member 621 and/or the second coil member 622 at the designated distance 650, the deterioration of radiation performance of the first coil member 621 and/or the second coil member 622, which may occur due to the coupling (or indirect coupling) of the first coil member 621 and/or the second coil member 622 and the plurality of dummy patterns 641 can be prevented.

Figure 7:
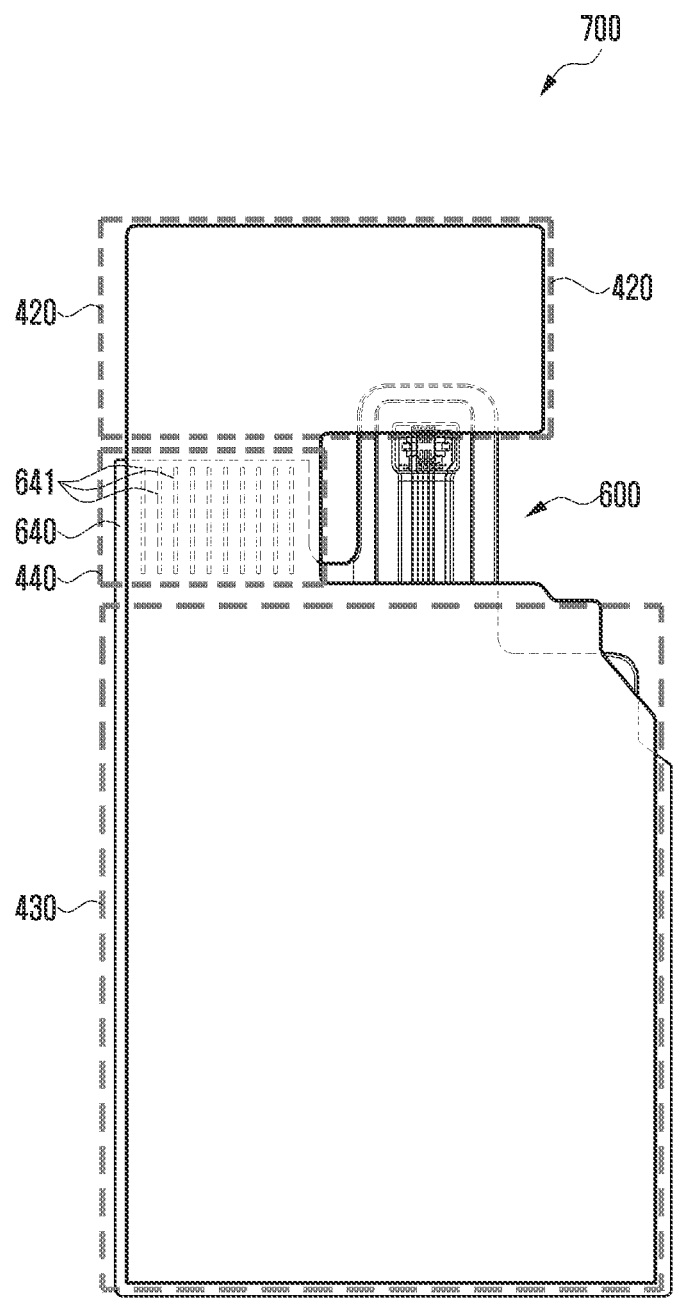
FIG. 7 is a diagram illustrating an arrangement of an antenna structure and a tape member according to an embodiment of the disclosure.

FIG. 7 is a diagram illustrating the arrangement of an antenna structure and a tape member according to an embodiment of the disclosure.

Referring to FIG. 7 illustrating an antenna structure 600, a tape member 700 may include the first region 420, the second region 430, and the connection part 440 connecting the first region 420 and the second region 430.

According to various embodiments, the first region 420 of the tape member 700 may at least partially overlap a support structure (e.g., the support structure 390 in FIG. 4). The second region 430 of the tape member 700 may at least partially overlap the antenna structure 600. The connection part 440 of the tape member 700 may at least partially overlap the at least one extension part 640 extended from the dielectric substrate 610.

In an embodiment, the at least one extension part 640 disposed in a way to at least partially overlap the connection part 440 of the tape member 700 may include the plurality of dummy patterns 641 formed at designated intervals and/or in a designated shape. As the at least one extension part 640 includes the plurality of dummy patterns formed at designated intervals and/or in a designated shape, the stiffness of the at least one extension part 640 can be increased.

Figure 8:
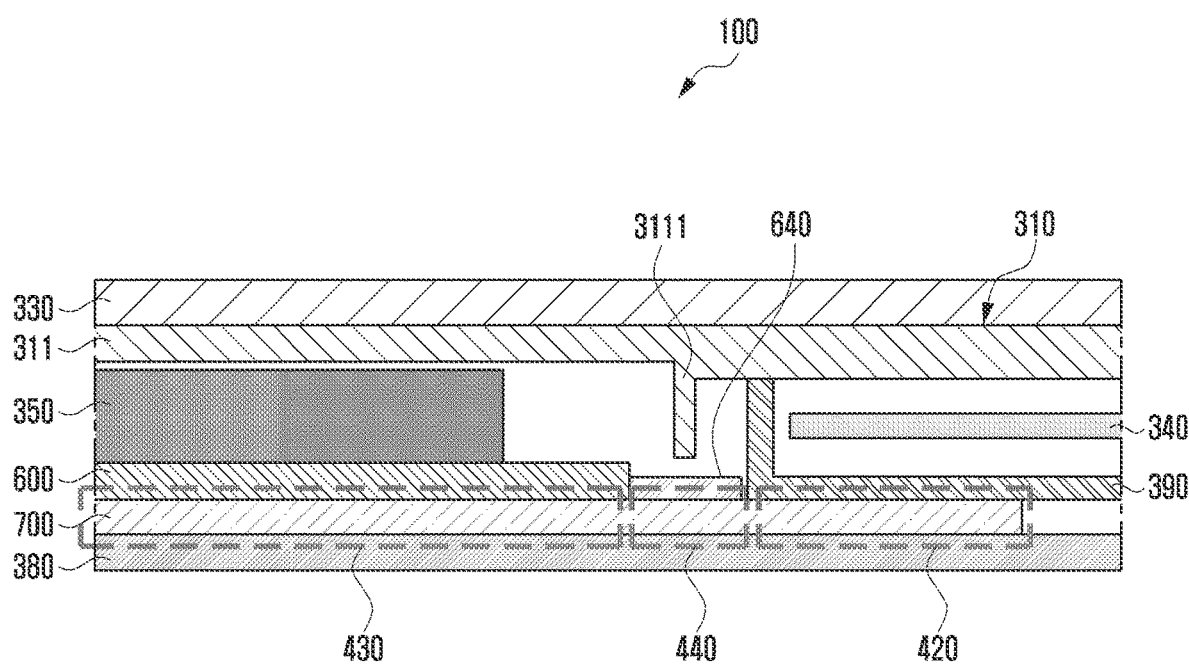
FIG. 8 is a cross-sectional view of an electronic device, which is viewed along line A-A' of FIG. 1, according to an embodiment of the disclosure.

FIG. 8 is a cross-sectional view of an electronic device, which is viewed along line A-A' of FIG. 1, according to an embodiment of the disclosure.

Referring to FIG. 8, an electronic device 100 may include a display 330, a lateral bezel structure 310, a support member 311, a substrate 340, a battery 350, a support structure 390, an antenna structure 600, a tape member 700 and/or a rear plate 380.

In an embodiment, the battery 350 may be disposed on the same plane as the substrate 340. The battery 350 may supply power to at least one element (e.g., the substrate 340) of the electronic device 100.

In an embodiment, the electronic device 100 may include a wall 3111 extended from a housing (e.g., the housing 110 in FIG. 1) to an internal space (e.g., the internal space 1001 in FIG. 1) at a designated height.

In an embodiment, the substrate 340 may be disposed in a first direction (e.g., the y direction in FIG. 3) with respect to the wall 3111. The battery 350 may be disposed in a second direction (e.g., the −y direction in FIG. 3), that is, a direction opposite to the first direction, with respect to the wall 3111.

In an embodiment, the antenna structure 600 may be disposed between the battery 350 and the rear plate 380. The antenna structure 600 may be disposed in a way to at least partially overlap the battery 350. The antenna structure 600 may include a dielectric substrate (e.g., the dielectric substrate 610 in FIG. 6A) and at least one coil member (e.g., the at least one coil member 620 in FIG. 6A) disposed in the dielectric substrate 610.

In an embodiment, the tape member 700 may be disposed between the antenna structure 600 and the rear plate 380. The tape member 700 may include the first region 420, the second region 430, and the connection part 440 connecting the first region 420 and the second region 430. The first region 420 of the tape member 700 may at least partially overlap the support structure 390. The second region 430 of the tape member 700 may at least partially overlap the antenna structure 600. The connection part 440 of the tape member 700 may at least partially overlap the at least one extension part 640 extended from the dielectric substrate 610 of the antenna structure 600.

In an embodiment, the wall 3111 may be disposed at a location overlapping the at least one extension part 640 of the antenna structure 600.

In an embodiment, the at least one extension part 640 may include a plurality of dummy patterns (e.g., the plurality of dummy patterns 641 in FIG. 6A) formed at designated intervals and/or in a designated shape. The stiffness of the at least one extension part 640 can be increased because the at least one extension part 640 includes the plurality of dummy patterns 641 formed at designated intervals and/or in a designated shape. Accordingly, a break in the at least one extension part 640 attributable to the wall 3111 disposed at a location overlapping the at least one extension part 640 can be prevented.

Figure 9:
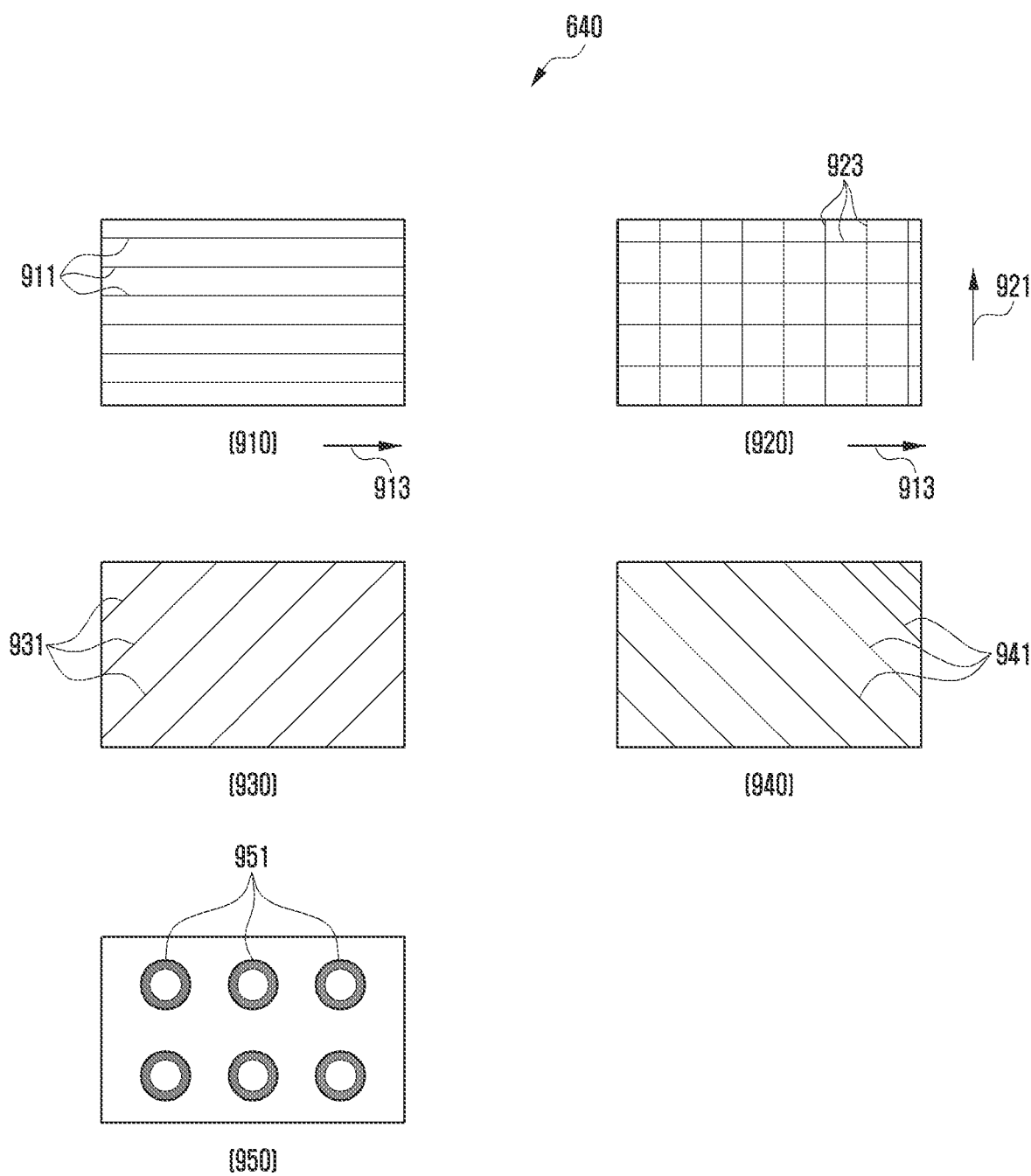
FIG. 9 is a diagram illustrating a plurality of dummy patterns forming at least one extension part of an antenna structure according to an embodiment of the disclosure.

FIG. 9 is a diagram illustrating a plurality of dummy patterns forming the at least one extension part of an antenna structure according to an embodiment of the disclosure.

Referring to FIG. 9, as illustrated in reference numeral <910>, the at least one extension part 640 of an antenna structure (e.g., the antenna structure 600 in FIG. 6A) may include a plurality of dummy patterns 911 formed to have respective lengths at designated intervals in a direction 913 of a connector unit (e.g., the connector unit 630 in FIG. 6A) of the antenna structure 600.

In various embodiments, as illustrated in reference numeral <920>, the at least one extension part 640 of the antenna structure 600 may include a plurality of dummy patterns 923 (e.g., a mesh pattern) formed to have respective lengths at designated intervals from the antenna structure 600 to a direction 921 of a substrate (e.g., the substrate 410 in FIG. 4) and the direction 913 of a connector unit 630 of the antenna structure 600.

In various embodiments, as illustrated in reference numerals <930> and <940>, the at least one extension part 640 of the antenna structure 600 may include a plurality of dummy patterns 931 and 941 each formed at designated intervals in a diagonal direction.

In various embodiments, as illustrated in reference numeral <950>, the at least one extension part 640 of the antenna structure 600 may include a plurality of dummy patterns consisting of a plurality of conductors 951.

Figure 10:
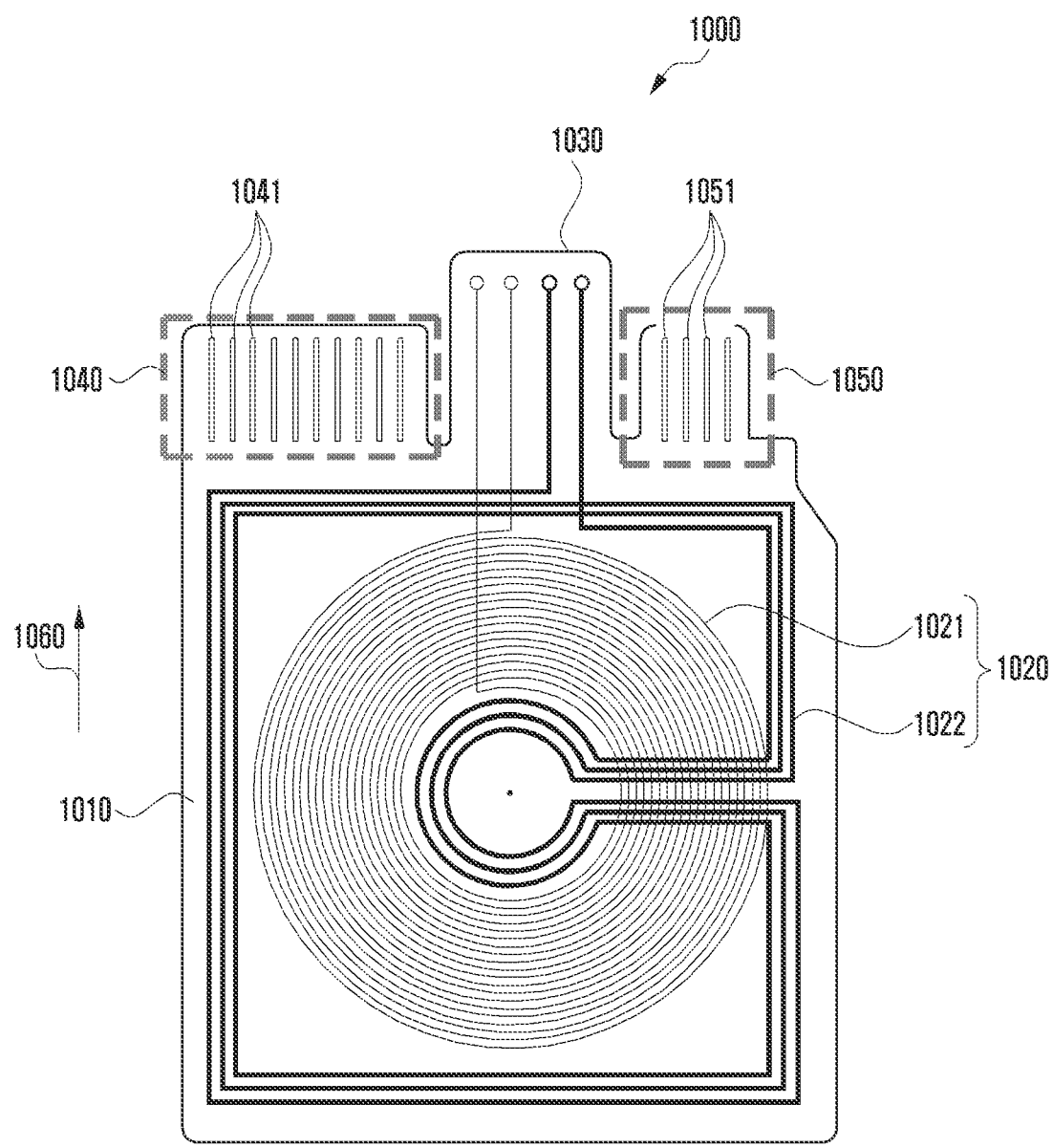
FIG. 10 is a diagram illustrating an antenna structure according to an embodiment of the disclosure.

FIG. 10 is a diagram illustrating an antenna structure according to an embodiment of the disclosure.

Referring to FIG. 10, an antenna structure 1000 (e.g., the antenna structure 600 in FIG. 6A) may include a dielectric substrate 1010 (e.g., the dielectric substrate 610 in FIG. 6A) and at least one coil member 1020 (e.g., the at least one coil member 620 in FIG. 6A) disposed in the dielectric substrate 1010. The dielectric substrate 1010 may include a plurality of extension parts extended from the dielectric substrate 1010, for example, a first extension part 1040 and a second extension part 1050. The first extension part 1040 may include a plurality of dummy patterns 1041 formed at designated intervals and/or in a designated shape. The second extension part 1050 may include a plurality of dummy patterns 1051 formed at designated intervals and/or in a designated shape. For example, the plurality of dummy patterns 1041 and 1051 may be formed to have respective lengths at designated intervals from the antenna structure 1000 to a direction 1060 of a substrate (e.g., the substrate 410 in FIG. 4), but the disclosure is not limited thereto. The plurality of dummy patterns 1041 and 1051 each may consist of any one pattern or combinations of at least two of the plurality of dummy patterns illustrated in reference numerals <910> to <950> of FIG. 9 (e.g., the plurality of dummy patterns 911 formed to have respective lengths at designated intervals in the direction of the connector unit 630 of the antenna structure 600, the plurality of dummy patterns 923 formed to have a mesh pattern, the plurality of dummy patterns 931 and 941 each formed at designated intervals in the diagonal direction, and the plurality of dummy patterns consisting of the plurality of conductors 951).

In various embodiments, the plurality of dummy patterns 1041 of the first extension part 1040 may be formed to have the same interval and/or shape as the plurality of dummy patterns 1051 of the second extension part 1050 or to have intervals and/or shape different from intervals and/or a shape of the plurality of dummy patterns 1051 of the second extension part 1050.

In an embodiment, the antenna structure 1000 may include a connector unit 1030 (e.g., the connector unit 630 in FIG. 6A) disposed so that the at least one coil member 1020 is elongated through the dielectric substrate 1010. The connector unit 1030 may be electrically connected to the substrate 410. The at least one coil member 620 may include a first coil member 1021 (e.g., the first coil member 621 in FIG. 6A) and a second coil member 1022 (e.g., the second coil member 622 in FIG. 6A). The first coil member 621 may include a coil member that transmits and/or receives signals having a frequency band designed to be used for NFC communication. The second coil member 622 may include a coil member that supports wireless charging. Although not illustrated, the at least one coil member 620 may further include a coil member that supports MST communication.

In various embodiments, the plurality of dummy patterns 1041 of the first extension part 1040 and the plurality of dummy patterns 1051 of the second extension part 1050 may be formed to be isolated from the first coil member 1021 and/or the second coil member 1022 at a designated distance (e.g., 650 in FIG. 6B). As the plurality of dummy patterns 1041 of the first extension part 1040 and the plurality of dummy patterns 1051 of the second extension part 1050 are formed to be isolated from the first coil member 1021 and/or the second coil member 1022 at the designated distance (e.g., 650 in FIG. 6B), the deterioration of radiation performance of the first coil member 1021 and/or the second coil member 1022, which may occur due to coupling (or indirect coupling) between the first coil member 1021 and/or the second coil member 1022 and the plurality of dummy patterns 1041 and 1051, can be prevented.

Figure 11:
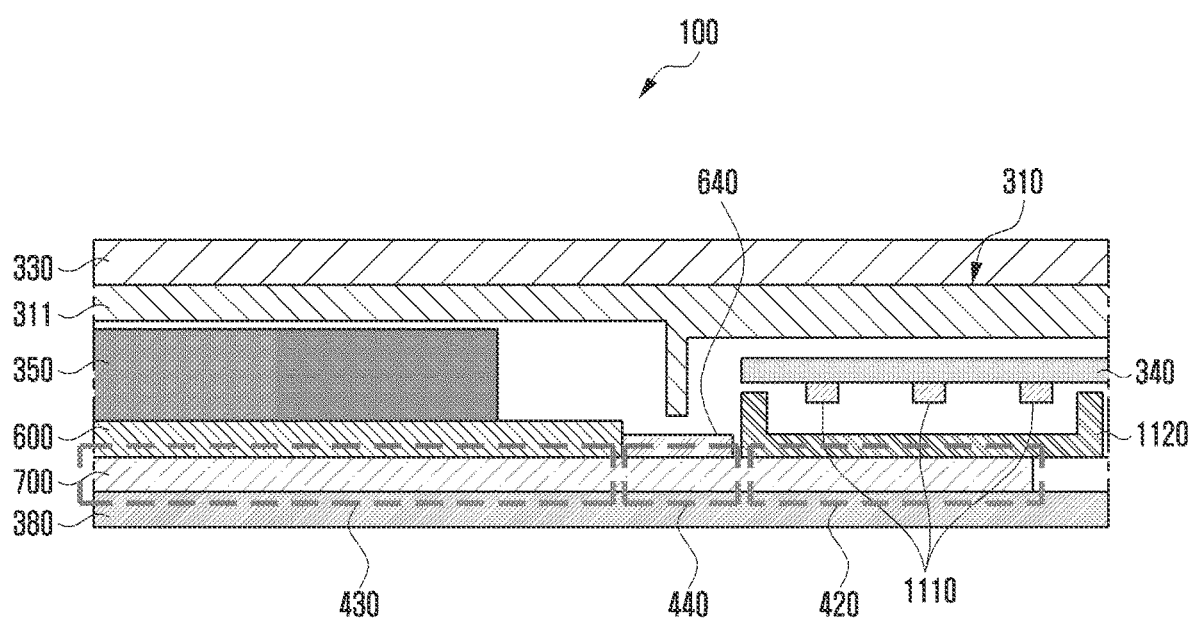
FIG. 11 is a cross-sectional view of an electronic device, which is viewed along line A-A' of FIG. 1, according to an embodiment of the disclosure.

FIG. 11 is a cross-sectional view of an electronic device, which is viewed along line A-A' of FIG. 1, according to an embodiment of the disclosure.

Referring to FIG. 11, an electronic device 100 may include a display 330, a lateral bezel structure 310, a support member 311, a substrate 340, a battery 350, a shield can 1120, an antenna structure 600, a tape member 700 and/or a rear plate 380.

In an embodiment, the antenna structure 600 may be disposed between the battery 350 and the rear plate 380. The antenna structure 600 may be disposed in a way to at least partially overlap the battery 350. The antenna structure 600 may include a dielectric substrate (e.g., the dielectric substrate 610 in FIG. 6A) and at least one coil member (e.g., the at least one coil member 620 in FIG. 6A) disposed in the dielectric substrate 610. The dielectric substrate 610 may include the at least one extension part 640 extended from the dielectric substrate 610.

In an embodiment, at least one electrical element 1110, such as an application processor (AP), a communication processor (CP), a memory and/or an interface, may be disposed in the substrate 340.

In an embodiment, the shield can 1120 can shield electromagnetic waves generated from at least one electrical element 1110 disposed in the substrate 340 or the at least one coil member 620 of the antenna structure 600.

In an embodiment, the tape member 700 may be disposed in the antenna structure 600 and the rear plate 380. The tape member 700 may be formed as a heat dissipation member for diffusing heat generated from the at least one electrical element 1110 through the shield can 1120. The heat dissipation member may include a graphite sheet or a thermal interface material (TIM) tape.

In an embodiment, the tape member 700 may include the first region 420, the second region 430, and the connection part 440 connecting the first region 420 and the second region 430. The first region 420 of the tape member 700 may at least partially overlap the shield can 1120. The second region 430 of the tape member 700 may at least partially overlap the antenna structure 600. The connection part 440 of the tape member 700 may at least partially overlap the at least one extension part 640 of the antenna structure 600.

The electronic device 100 according to various embodiments includes a housing (e.g., the housing 110 in FIG. 1), the substrate 340 disposed in an internal space (e.g., the internal space 1001 in FIG. 1) of the housing 110, the battery 350 disposed on the same plane as the substrate 340, the support structure 390 disposed to at least partially overlap the substrate 340 when the substrate 340 is viewed from the top, the antenna structure 600 including the dielectric substrate 610 and the at least one coil member 620 disposed in the dielectric substrate 610 as the antenna structure 500 disposed to at least partially overlap the battery 350 when the battery 350 is viewed from the top, and the tape member 700 including the first region 420 at least partially overlapping the support structure 390, the second region 430 at least partially overlapping the antenna structure, and the connection part 440 connecting the first region 420 and the second region 430, when the support structure 390 is viewed from the top. The dielectric substrate 610 may include the at least one extension part 640 extended from the dielectric substrate 610 and at least partially overlapping the connection part 440 when the antenna structure 600 is viewed from the top. The at least one extension part 640 may include the plurality of dummy patterns 641 formed at designated intervals and/or in a designated shape.

According to various embodiments, the at least one extension part 640 may be attached to the connection part 440 through the adhesion member 555.

According to various embodiments, the shortest distance between the plurality of dummy patterns 641 and the at least one coil member 620 may be determined not to affect radiation performance of the at least one coil member 620.

According to various embodiments, the antenna structure 600 may be disposed between the tape member 700 and the sealing member 551.

According to various embodiments, the housing 110 may include the front plate 320, the rear plate 380 toward a direction opposite to the direction of the front plate 320, and the side member (e.g., lateral bezel structure 118) surrounding the internal space 1001 between the front plate 320 and the rear plate 380. The tape member 700 may be disposed between the antenna structure 600 and the rear plate 380.

According to various embodiments, the electronic device 100 may include the shielding member 554 disposed between the antenna structure 600 and the sealing member 551.

According to various embodiments, the electronic device 100 may include a functional member disposed between the tape member 700 and the sealing member 551.

According to various embodiments, the functional member may include the step compensation member 553 for compensating for a thickness of the antenna structure 600 and/or the heat dissipation member 552.

The electronic device 100 according to various embodiments may further include the wall 3111 extended from the housing 110 to the internal space 1001 at a designated height. The wall 3111 may be disposed at a location overlapping the at least one extension part 640 when the antenna structure 600 is viewed from the top.

According to various embodiments, the substrate 340 may be disposed in a first direction (e.g., the y direction in FIG. 3) with respect to the wall 3111.

According to various embodiments, the battery 350 may be disposed in a second direction (e.g., the −y direction in FIG. 3), that is, a direction opposite to the first direction, with respect to the wall 3111.

According to various embodiments, the plurality of dummy patterns 641 may be formed to have respective lengths at designated intervals from the antenna structure 600 to the direction of the substrate 340.

According to various embodiments, the support structure 390 may further include the shield can 1120 for shielding the at least one electrical element 1110 disposed in the substrate 340.

According to various embodiments, the tape member 700 may be formed as a heat dissipation member.

According to various embodiments, the heat dissipation member may be configured to diffuse heat generated from the at least one electrical element through the shield can 1120.

According to various embodiments, the heat dissipation member may include a graphite sheet or a thermal interface material (TIM) tape.

According to various embodiments, the electronic device 100 may include a shielding member disposed on the at least one extension part 640 extended from the dielectric substrate 610 when the antenna structure 600 is viewed from the top.

According to various embodiments, the antenna structure 600 may include the connector unit 630 disposed so that the at least one coil member 620 is elongated through the dielectric substrate 610.

According to various embodiments, the substrate 340 may include a wireless communication circuit electrically connected to the connector unit 630 and configured to transmit and/or receive radio signals in at least one frequency band through the at least one coil member 620.

According to various embodiments, the substrate 340 may include a charging circuit electrically connected to the connector unit 630 and configured to transmit and/or receive wireless charging signals through the at least one coil member 620.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a housing;
a substrate disposed in an internal space of the housing;
a battery disposed on a plane identical with a plane of the substrate;
a support structure disposed to at least partially overlap the substrate when the substrate is viewed from a top;
an antenna structure configured to include a dielectric substrate and at least one coil member disposed in the dielectric substrate as an antenna disposed to at least partially overlap the battery when the battery is viewed from the top; and
a tape member configured to include a first region at least partially overlapping the support structure, a second region at least partially overlapping the antenna structure, and a connection part connecting the first region and the second region when the support structure is viewed from the top,
wherein the dielectric substrate comprises at least one extension part extended from the dielectric substrate and configured to at least partially overlap the connection part when the antenna structure is viewed from the top, and
wherein the at least one extension part comprises a plurality of dummy patterns formed at designated intervals and/or in a designated shape.

2. The electronic device of claim 1, wherein the at least one extension part is attached to the connection part through an adhesion member.

3. The electronic device of claim 1, wherein a shortest distance between the plurality of dummy patterns and the at least one coil member is determined not to affect radiation performance of the at least one coil member.

4. The electronic device of claim 1, wherein the antenna structure is disposed between the tape member and a sealing member.

5. The electronic device of claim 4,
wherein the housing comprises:
a front plate,
a rear plate toward a direction opposite to a direction of the front plate, and
a side member configured to surround the internal space between the front plate and the rear plate, and
wherein the tape member is disposed between the antenna structure and the rear plate.

6. The electronic device of claim 4, further comprising a shielding member disposed between the antenna structure and the sealing member.

7. The electronic device of claim 4, further comprising a functional member disposed between the tape member and the sealing member.

8. The electronic device of claim 7, wherein the functional member comprising a step compensation member configured to compensate for a thickness of the antenna structure and/or a heat dissipation member.

9. The electronic device of claim 1, further comprising:
a wall extended from the housing to the internal space at a designated height,
wherein the wall is disposed at a location overlapping the at least one extension part when the antenna structure is viewed from the top.

10. The electronic device of claim 9, wherein the substrate is disposed in a first direction with respect to the wall.

11. The electronic device of claim 10, wherein the battery is disposed in a second direction which is a direction opposite to the first direction with respect to the wall.

12. The electronic device of claim 1, wherein the plurality of dummy patterns is formed to have respective lengths at designated intervals from the antenna structure to a direction of the substrate.

13. The electronic device of claim 1, wherein the support structure further comprises a shield can for shielding at least one electrical element disposed in the substrate.

14. The electronic device of claim 13, wherein the tape member is formed as a heat dissipation member.

15. The electronic device of claim 14, wherein the heat dissipation member is configured to diffuse heat generated from the at least one electrical element through the shield can.

16. The electronic device of claim 14, wherein the heat dissipation member comprises a graphite sheet or a thermal interface material (TIM) tape.

17. The electronic device of claim 1, further comprising a shielding member disposed on the at least one extension part extended from the dielectric substrate when the antenna structure is viewed from the top.

18. The electronic device of claim 1, wherein the antenna structure comprises a connector circuitry disposed so that the at least one coil member is elongated through the dielectric substrate.

19. The electronic device of claim 18, wherein the substrate comprises a wireless communication circuit electrically connected to the connector circuitry and configured to transmit and/or receive radio signals in at least one frequency band through the at least one coil member.

20. The electronic device of claim 18, wherein the substrate comprises a charging circuit electrically connected to the connector circuitry and configured to transmit and/or receive wireless charging signals through the at least one coil member.

* * * * *